(12) United States Patent
Archer

(10) Patent No.: US 9,064,810 B2
(45) Date of Patent: Jun. 23, 2015

(54) MESA ETCH METHOD AND COMPOSITION FOR EPITAXIAL LIFT OFF

(75) Inventor: Melissa Archer, Mountain View, CA (US)

(73) Assignee: Alta Devices, Inc., Santa Clara, CA (US)

( * ) Notice: Subject to any disclaimer, the term of this patent is extended or adjusted under 35 U.S.C. 154(b) by 630 days.

(21) Appl. No.: 12/577,645

(22) Filed: Oct. 12, 2009

(65) Prior Publication Data

US 2010/0116784 A1 May 13, 2010

Related U.S. Application Data

(60) Provisional application No. 61/104,287, filed on Oct. 10, 2008.

(51) Int. Cl.
 B44C 1/22 (2006.01)
 H01L 21/306 (2006.01)
 H01L 21/78 (2006.01)

(52) U.S. Cl.
 CPC .... H01L 21/30617 (2013.01); H01L 21/30612 (2013.01); H01L 21/7806 (2013.01)

(58) Field of Classification Search
 CPC .............. H01L 21/30612; H01L 21/30617; H01L 21/7806; H01L 21/0272; H05K 3/048
 USPC .......... 216/24, 40, 83, 95, 96; 252/79.1, 79.4, 252/79.5
 See application file for complete search history.

(56) References Cited

U.S. PATENT DOCUMENTS

| | | | |
|---|---|---|---|
| 3,993,533 A | 11/1976 | Milnes et al. | |
| 4,445,965 A | 5/1984 | Milnes | |
| 4,727,047 A | 2/1988 | Bozler et al. | |
| 4,846,931 A | 7/1989 | Gmitter et al. | |
| 4,883,561 A | 11/1989 | Gmitter et al. | |
| 5,073,230 A | 12/1991 | Maracas et al. | |
| 5,122,852 A | 6/1992 | Chang et al. | |
| 5,175,740 A * | 12/1992 | Elman et al. | 372/45.01 |
| 5,201,996 A | 4/1993 | Gmitter et al. | |
| 5,221,637 A | 6/1993 | De Boeck | |
| 5,256,562 A | 10/1993 | Vu et al. | |
| 5,258,325 A | 11/1993 | Spitzer et al. | |
| 5,276,345 A | 1/1994 | Siegel et al. | |
| 5,277,749 A | 1/1994 | Griffith et al. | |
| 5,286,335 A | 2/1994 | Drabik et al. | |
| 5,344,517 A | 9/1994 | Houlding | |
| 5,357,535 A * | 10/1994 | Shima et al. | 372/45.01 |
| 5,401,983 A | 3/1995 | Jokerst et al. | |
| 5,458,694 A | 10/1995 | Nuyen | |
| 5,465,009 A | 11/1995 | Drabik et al. | |
| 5,476,810 A | 12/1995 | Curran | |
| 5,479,043 A | 12/1995 | Nuyen | |
| 5,528,719 A | 6/1996 | Yamada | |
| 5,546,375 A | 8/1996 | Shimada et al. | |
| 5,641,381 A | 6/1997 | Bailey et al. | |
| 5,827,751 A | 10/1998 | Nuyen | |
| 5,985,742 A | 11/1999 | Henley et al. | |
| 6,010,579 A | 1/2000 | Henley et al. | |
| 6,071,795 A | 6/2000 | Cheung et al. | |
| 6,155,909 A | 12/2000 | Henley et al. | |
| 6,214,733 B1 * | 4/2001 | Sickmiller | 438/691 |
| 6,221,740 B1 | 4/2001 | Bryan et al. | |
| 6,232,136 B1 | 5/2001 | Zavracky et al. | |
| 6,263,941 B1 | 7/2001 | Bryan et al. | |
| 6,284,631 B1 | 9/2001 | Henley et al. | |
| 6,287,891 B1 | 9/2001 | Sayyah | |
| 6,290,804 B1 | 9/2001 | Henley et al. | |
| 6,291,313 B1 | 9/2001 | Henley et al. | |
| 6,294,814 B1 | 9/2001 | Henley et al. | |
| 6,346,459 B1 | 2/2002 | Usenko et al. | |
| 6,352,909 B1 | 3/2002 | Usenko | |
| 6,387,829 B1 | 5/2002 | Usenko et al. | |
| 6,391,740 B1 | 5/2002 | Cheung et al. | |
| 6,414,783 B2 | 7/2002 | Zavracky et al. | |
| 6,458,672 B1 | 10/2002 | Henley et al. | |
| 6,486,041 B2 | 11/2002 | Henley et al. | |
| 6,500,732 B1 | 12/2002 | Henley et al. | |
| 6,504,524 B1 | 1/2003 | Gates et al. | |
| 6,511,899 B1 | 1/2003 | Henley et al. | |

(Continued)

FOREIGN PATENT DOCUMENTS

WO  WO-2006131316 A1  12/2006

OTHER PUBLICATIONS

Bauhuis, G.J., "Substrate Reuse for Epitaxial Lift-Off of III-V Solar Cells", Proceedings of the 22nd European Photovoltaic Solar Energy Conference: Milan, Sep. 3-7, 2007, pp. 106-110.
Bauhuis, G.J., "Thin film GaAs solar cells with increased quantum efficiency due to light reflection", Solar Energy Materials & Solar Cells 83 (2004) 81-90, Nov. 3, 2003.
Konagai, Makoto, "High Efficiency GaAs Thin Film Solar Cells by Peeled Film Technology", Journal of Crystal Growth 45 (1978) 277-280.
Kumar, P., "Sacrificial etching of $Al_xGa_{1-x}As$ for III-V MEMS surface micromachining", Appl. Phys. A 88, 711-714, May 24, 2007.
Schermer, J.J., "Epitaxial Lift-Off for large area thin film III/V devices", Phys. Stat. Sol. (1) 202, No. 4, 501-508 (2005).
Schermer, J.J., "Photon confinement in high-efficiency, thin-film III-V solar cells obtained by epitaxial lift-off", Thin Solid Films 511-512 (2006) 645-653, Jan. 19, 2006.

(Continued)

Primary Examiner — Shamim Ahmed

(57) ABSTRACT

Embodiments of the invention generally relate to compositions of mesa etch solutions and methods for mesa etching materials on a wafer during an epitaxial lift off (ELO) process. The wafer usually contains an etch stop layer disposed thereon and a laminated epitaxial material disposed on the etch stop layer. In one embodiment, an etch process includes exposing the wafer to a non-selective etch solution and subsequently exposing the wafer to a selective etch solution while peeling the laminated epitaxial material from the wafer. The selective etch solution may contain succinic acid, an ammonium hydroxide compound, and an oxidizing agent, such as hydrogen peroxide. The selective etch solution may have a GaAs/AlAs selectivity of about 600, about 1,000, about 1,400, or greater. The non-selective etch solution may be an aqueous solution containing sulfuric acid and hydrogen peroxide.

20 Claims, No Drawings

(56) References Cited

U.S. PATENT DOCUMENTS

| | | | |
|---|---|---|---|
| 6,513,564 | B2 | 2/2003 | Bryan et al. |
| 6,528,391 | B1 | 3/2003 | Henley et al. |
| 6,548,382 | B1 | 4/2003 | Henley et al. |
| 6,554,046 | B1 | 4/2003 | Bryan et al. |
| 6,559,075 | B1 | 5/2003 | Kelly et al. |
| 6,573,129 | B2 | 6/2003 | Hoke et al. |
| 6,589,811 | B2 | 7/2003 | Sayyah |
| 6,632,724 | B2 | 10/2003 | Henley et al. |
| 6,666,943 | B2 | 12/2003 | Wada et al. |
| 6,669,801 | B2 | 12/2003 | Yoshimura et al. |
| 6,677,249 | B2 | 1/2004 | Laermer et al. |
| 6,740,604 | B2 | 5/2004 | Kelly et al. |
| 6,790,747 | B2 | 9/2004 | Henley et al. |
| 6,809,044 | B1 | 10/2004 | Aspar et al. |
| 6,890,838 | B2 | 5/2005 | Henley et al. |
| 6,943,050 | B2 | 9/2005 | Kondo |
| 6,974,521 | B2 | 12/2005 | Schermer |
| 7,030,032 | B2 | 4/2006 | Marsh et al. |
| 7,045,878 | B2 | 5/2006 | Faris |
| 7,056,808 | B2 | 6/2006 | Henley et al. |
| 7,060,591 | B2 | 6/2006 | Yamazaki et al. |
| 7,153,761 | B1 | 12/2006 | Nastasi et al. |
| 7,160,790 | B2 | 1/2007 | Henley et al. |
| 7,163,826 | B2 | 1/2007 | Faris |
| 7,198,671 | B2 | 4/2007 | Ueda |
| 7,202,141 | B2 | 4/2007 | Park et al. |
| 7,229,901 | B2 | 6/2007 | Savage et al. |
| 7,241,667 | B2 | 7/2007 | Park et al. |
| 7,341,925 | B2 | 3/2008 | Kelly et al. |
| 7,348,258 | B2 | 3/2008 | Henley et al. |
| 7,638,410 | B2 | 12/2009 | Nastasi et al. |
| 2003/0060057 | A1* | 3/2003 | Raaijmakers et al. ......... 438/770 |
| 2003/0205241 | A1* | 11/2003 | Aoki ................................. 134/3 |
| 2004/0134416 | A1* | 7/2004 | Furuyama ....................... 117/84 |
| 2009/0321881 | A1 | 12/2009 | Archer et al. |
| 2009/0321885 | A1 | 12/2009 | Archer et al. |
| 2009/0321886 | A1 | 12/2009 | Gmitter et al. |
| 2009/0324379 | A1 | 12/2009 | He et al. |
| 2009/0325367 | A1 | 12/2009 | He et al. |
| 2010/0001316 | A1 | 1/2010 | Gmitter et al. |
| 2010/0001374 | A1 | 1/2010 | Gmitter et al. |

OTHER PUBLICATIONS

Schermer, J.J., "Thin-film GaAs Epitaxial Lift-Off Solar Cells for Space Applications", Prog. Photovolt: Res. Appl. 2005; 13:587-596, Apr. 28, 2005.

Schermer, John, "Solar Cells Based on III-V Semiconductors", Joint Solar Panel, Sep. 29, 2004.

Sickmiller, Mike, "Packaging of Ultrathin Semiconductor Devices Through The ELO Packaging Process", Mat. Res. Soc. Symp. Proc. vol. 681E (2001).

van Deelen, J. "On the development of high-efficiency thin-film GaAs and GaInP2 cells", Journal of Cyrstal Growth 298 (2007) 772-776, Nov. 28, 2006.

van Niftrik, A. T. J., "HF Species and Dissolved Oxygen on the Epitaxial Lift-Off Process of GaAs Using AlAsP Release Layers", Journal of The Electrochemical Society, 155 (1) D35-D39 (2008), Nov. 6, 2007.

van Niftrik, A.T.J., "A Diffusion and Reaction Related Model of the Epitaxial Lift-Off Process", Journal of the Electrochemical Society, 154 (11) D629-D635 (2007), Sep. 19, 2007.

van Niftrik, Antonius T. J., "The Influence of $In_xGa_{1-x}As$ and $GaAs_{1-y}P_y$ Layers Surrounding the AlAs Release Layer in the Epitaxial Lift-Off Process", Crystal Growth & Design, 2007, vol. 7, No. 12, 2472-2480, Aug. 7, 2007.

Voncken, M.M.A.J., "Strain-accelerated HF etching of AlAs for epitaxial lift-off", J. Phys.: Condens. Matter 16 (2004) 3585-3596, May 14, 2004.

Voncken, M.M.A.J., "Influence of radius of curvature on the lateral etch rate of the weight induced epitaxial lift-off process", Material Science and Engineering B95 (2002) 242-248, May 21, 2002.

Voncken, M.M.A.J., "Multiple release layer study of the intrinsic lateral etch rate of the epitaxial lift-off process", Appl. Phys. A 79, 1801-1807, Mar. 28, 2003.

Yablonovitch, E., "Van De Waals bonding of GaAs epitaxial liftoff films onto arbitrary substrates", Appl. Phys. Lett. 56 (24), Jun. 11, 1990.

A.J. Tang et al article, "Selective Etching of AlxGa1-xAs and In(AlxGa1-x)As Alloys in Succinic Acid- Hydrogen Peroxide Solutions." J. Electrochem. Soc., vol. 140, No. 5, May 1993, pp. L82-L83.

Scott A. Merritt et al article, "Etch Characteristics of Succinic Acid/Ammonia/Hydrogen Peroxide versus Aluminum Mole Fraction in AlGaAs." J. Electrochem. Soc., vol. 140, No. 9, Sep. 1993, pp. L138-L139.

Tom P.E. Broekaert et al article, "Novel, Organic Acid-Based Etchants for InGaAlAs/InP Heterostructure Devices with AlAs Etch-Stop Layers." Journal of the Electrochemical Society, vol. 139, No. 8, Aug. 1992, pp. 2306-2309.

PCT International Search Report and Written Opinion dated Apr. 29, 2010 for International Application No. PCT/US2009/060382.

* cited by examiner

MESA ETCH METHOD AND COMPOSITION FOR EPITAXIAL LIFT OFF

CROSS-REFERENCE TO RELATED APPLICATION

This application claims benefit of U.S. Ser. No. 61/104,287, filed Oct. 10, 2008, which is incorporated herein by reference in its entirety.

BACKGROUND OF THE INVENTION

1. Field of the Invention

Embodiments of the invention generally relate to the fabrication of solar, semiconductor, and electronic devices, and more particularly to mesa etch methods and compositions, as well as to epitaxial lift off (ELO) devices and methods.

2. Description of the Related Art

One phase in device fabrication involves handling and packaging of thin films used as solar devices, semiconductor devices, or other electronic devices. Such thin film devices may be manufactured by utilizing a variety of processes for depositing and removing materials onto a wafer or other substrate. One uncommon technique for manufacturing thin film devices is known as the epitaxial lift off (ELO) process. The traditional ELO process includes depositing an epitaxial layer or film on a sacrificial layer on a growth substrate, then etching the sacrificial layer to separate the epitaxial layer from the growth substrate. The thin epitaxial layer removed is known as the ELO film or layer and typically includes thin films used as solar devices, semiconductor devices, or other electronic devices.

The thin ELO films are very difficult to manage or handle, such as when bonding to a substrate or while packaging, since the ELO films are very fragile and have narrow dimensions. The ELO films crack under very small forces. Also, the ELO films are very difficult to move due to their extremely narrow dimensions.

The speed of the overall process may be limited by the lack of delivery or exposure of reactant to the etch front, which leads to less removal of by products from the etch front. The etching process may be a diffusion limited process and if the films were maintained in their as deposited geometries, a very narrow and long opening or crevice would form and severely limit the overall speed of the process. Reactants move towards the etch front while by-products generally move away from the etch front.

The etching process must be fast in order to obtain high throughput of the overall fabrication process, as well as to reduce the duration in which the epitaxial layer is under undue strain or force. Therefore, the etch solution must be aggressive at removing targeted materials, but also selective, so not to etch non-targeted materials. Low throughput may be experienced if the etch solution is not very chemically aggressive or too dilute. Also, the wafers must also not be over-etched, contaminated, or otherwise damaged during the ELO etching process. The wafers, especially gallium arsenide wafers, are valuable and ideally would be used through many cycles of depositing and removing materials from the surface of the wafer.

Therefore, there is a need for alternative etching compositions and methods used during device fabrication, such as during an ELO process.

SUMMARY OF THE INVENTION

Embodiments of the invention generally relate to compositions of mesa etch solutions, as well as to mesa etching methods which utilize these solutions for removing materials from a wafer or substrate during an epitaxial lift off (ELO) process. In one embodiment, a selective etch solution contains succinic acid, a basic solution containing an ammonium hydroxide compound, and an oxidizing agent, such as hydrogen peroxide. The selective etch solution has a GaAs/AlAs selectivity of about 400 or greater, preferably, about 600 or greater, preferably, about 1,000 or greater, and more preferably, about 1,400 or greater.

The selective etch solution usually contains a basic solution, such as an aqueous solution containing an ammonium hydroxide compound. The ammonium hydroxide compound may be ammonium hydroxide, alkylammonium hydroxides, derivatives thereof, or combinations thereof. In one example, the basic solution contains ammonium hydroxide. The selective etch solution further contains an oxidizing agent, such as hydrogen peroxide, organic peroxides, ozone, water, derivatives thereof, and combinations thereof. In one example, the oxidizing agent is hydrogen peroxide. In one example, the selective etch solution contains succinic acid, an ammonium hydroxide compound, an oxidizing agent, and the selective etch solution has a GaAs/AlAs selectivity of about 400 or greater.

In many embodiments of the methods and the compositions, the selective etch solution contains succinic acid, hydrogen peroxide, ammonium hydroxide, and water. In some examples, the selective etch solution may contain succinic acid at a weight concentration within a range from about 5% to about 25%, preferably, from about 10% to about 20%, and more preferably, from about 12% to about 18%, for example, about 15%. The selective etch solution may contain the oxidizing agent (e.g., hydrogen peroxide) at a weight concentration within a range from about 0.5% to about 5%, preferably, from about 1% to about 3%, and more preferably, from about 1% to about 2%, for example, about 1.5%. In some examples, the selective etch solution may contain an ammonium hydroxide compound (e.g., ammonium hydroxide) at a weight concentration within a range from about 0.5% to about 5%, preferably, from about 1% to about 3%, and more preferably, from about 1% to about 2%, for example, about 1.5%. In some examples, the selective etch solution may contain water at a weight concentration within a range from about 70% to about 95%, preferably, from about 74% to about 88%, and more preferably, from about 78% to about 84%, for example, about 82%. The pH value of the selective etch solution may be within a range from about 2 to about 6, preferably, from about 3 to about 5, preferably, from about 3.6 to about 4.8, and more preferably, from about 4.0 to about 4.4.

In one example, the selective etch solution contains succinic acid at a weight concentration within a range from about 10% to about 20%, hydrogen peroxide at a weight concentration within a range from about 1% to about 3%, ammonium hydroxide at a weight concentration within a range from about 1% to about 3%, and the remainder may be water or water may be at a weight concentration within a range from about 74% to about 88%.

In other embodiments, a method for forming a thin film material during an ELO process is provided which includes exposing the substrate to a non-selective etch solution during a non-selective etch process prior to exposing the substrate to the selective etch solution. The non-selective etch solution may be an aqueous solution containing sulfuric acid and hydrogen peroxide.

In some examples, the non-selective etch solution may contain sulfuric acid at a volumetric concentration within a range from about 0.4% to about 2%, preferably, from about 0.6% to about 1.2%, hydrogen peroxide at a volumetric concentration within a range from about 1% to about 5%, preferably, from about 1.5% to about 3.0%, and water at a volumetric concentration within a range from about 95% to about 99%, preferably, from about 96% to about 98%. In one example, the non-selective etch solution may contain, by volume, about 0.9% of sulfuric acid, about 2.2% of hydrogen peroxide, and about 97% or the remainder of deionized water. The substrate may be rinsed with deionized water after the non-selective etch process and/or the selective etch process during a rinse step. In other embodiments, the substrates may also be exposed to a drying gas (e.g., $N_2$ or Ar) during drying step.

In other embodiments, a method provides forming a laminated epitaxial material over an etch stop layer on the wafer or substrate and adhering a support handle thereon. The laminated epitaxial material contains a material surrounding or encapsulating at least a portion of the epitaxial material, such as the gallium arsenide material, cell, or layer. The encapsulating material may be an adhesive laminate containing a polymer, a copolymer, an oligomer, or derivatives thereof. In many examples, the encapsulating material is a pressure sensitive adhesive (PSA) or other adhesive laminate. In other examples, the encapsulating material is a hot-melt adhesive surrounding at least a portion of the epitaxial material. In some examples, the encapsulating material may contain polyvinyl, polycarbonate, polyester, derivatives thereof, or combinations thereof.

The method further provides exposing the substrate to at least one etch solution to remove the etch stop layer while peeling the laminated epitaxial material from the substrate and maintaining compression in the laminated epitaxial material during the etch process. The substrate may contain a support handle disposed on or over a laminated epitaxial material disposed on or over an etch stop layer disposed on or over the substrate. In one example, the etch solution is a selective etch solution and the etch process is a selective etch process. In another example, the wafer or substrate is initially exposed to a non-selective etch solution and subsequently exposed to a selective etch solution during the etch process.

DETAILED DESCRIPTION

Embodiments of the invention generally relate to compositions of etch solutions, as well as to etching methods which utilize the etch solutions for removing materials from a wafer or substrate during an epitaxial lift off (ELO) process. The wafer usually contains an etch stop layer containing aluminum arsenide disposed thereon and a laminated epitaxial material disposed on the etch stop layer. In one embodiment, an etch process includes exposing the wafer to a non-selective etch solution and subsequently exposing the wafer to a selective etch solution while peeling and removing the laminated epitaxial material from the wafer. The selective etch solution may have a GaAs/AlAs selectivity of about 400, about 600, about 1,000, about 1,400, or greater.

The selective etch solution may contain an organic acid, a basic solution, and/or an oxidizing agent. In many embodiments, the organic acid may be succinic acid, which is also known as butanedioic acid or ethane-1,2-dicarboxylic acid ($HO_2CH_2CH_2CO_2H$). The selective etch solution may contain succinic acid, an ammonium hydroxide compound, and an oxidizing agent, such as hydrogen peroxide. In some examples, the selective etch solution may contain succinic acid at a weight concentration within a range from about 5% to about 25%, preferably, from about 10% to about 20%, and more preferably, from about 12% to about 18%, for example, about 15%.

The selective etch solution further contains an oxidizing agent. The selective etch solution may contain the oxidizing agent at a weight concentration within a range from about 0.5% to about 5%, preferably, from about 1% to about 3%, and more preferably, from about 1% to about 2%, for example, about 1.5%. Exemplary oxidizing agents include hydrogen peroxide, organic peroxides, ozone, water, derivatives thereof, and combinations thereof. In one example, the selective etch solution contains hydrogen peroxide at a weight concentration within a range from about 0.5% to about 5%, preferably, from about 1% to about 3%, and more preferably, from about 1% to about 2%, for example, about 1.5%.

The selective etch solution usually contains a basic solution, such as an aqueous solution containing an ammonium hydroxide compound. The selective etch solution may contain an ammonium hydroxide compound (e.g., ammonium hydroxide) at a weight concentration within a range from about 0.5% to about 5%, preferably, from about 1% to about 3%, and more preferably, from about 1% to about 2%, for example, about 1.5%. The ammonium hydroxide compound may be ammonium hydroxide, alkylammonium hydroxides, derivatives thereof, or combinations thereof. Alkylammonium hydroxides may include methyl ammonium hydroxide, dimethyl ammonium hydroxide, trimethyl ammonium hydroxide, tetramethyl ammonium hydroxide, as well as other alkylated derivatives. In one example, the basic solution contains ammonium hydroxide.

The selective etch solution further contains water, such as deionized water. The selective etch solution may contain water at a weight concentration within a range from about 70% to about 95%, preferably, from about 74% to about 88%, and more preferably, from about 78% to about 84%, for example, about 82%.

The ammonium hydroxide compound may be titrated or otherwise added to the selective etch solution in order to adjust the overall pH of the solution. The pH value of the selective etch solution may be within a range from about 2 to about 6, preferably, from about 3 to about 5, preferably, from about 3.6 to about 4.8, and more preferably, from about 4.0 to about 4.4.

In many embodiments, the selective etch solution usually contains succinic acid, an ammonium hydroxide compound, an oxidizing agent, and the selective etch solution has a GaAs/AlAs selectivity of about 400 or greater. In one example, the selective etch solution contains succinic acid at a weight concentration within a range from about 10% to about 20%, hydrogen peroxide at a weight concentration within a range from about 1% to about 3%, ammonium hydroxide at a weight concentration within a range from about 1% to about 3%, and the remainder of water or water at a weight concentration within a range from about 74% to about 88%.

In other embodiments, a method provides forming a laminated epitaxial material over an etch stop layer on the wafer or substrate and adhering a support handle thereon. The method further provides exposing the substrate to at least one etch solution while peeling the laminated epitaxial material from the substrate and maintaining compression in the laminated epitaxial material during the etch process. The substrate may contain a support handle disposed on or over a laminated epitaxial material disposed on or over an etch stop layer disposed on or over the substrate. In one example, the etch solution is a selective etch solution and the etch process is a selective etch process. In another example, the wafer or substrate is initially exposed to a non-selective etch solution and subsequently exposed to a selective etch solution during the etch process.

In other embodiments, a method for forming a thin film material during an ELO process is provided which includes exposing the substrate to a non-selective etch solution during a non-selective etch process prior to exposing the substrate to the selective etch solution. The non-selective etch solution may contain sulfuric acid and hydrogen peroxide. In some examples, the non-selective etch solution may contain sulfuric acid at a volumetric concentration within a range from about 0.4% to about 2%, preferably, from about 0.6% to about 1.2%, hydrogen peroxide at a volumetric concentration within a range from about 1% to about 5%, preferably, from about 1.5% to about 3.0%, and water at a volumetric concentration within a range from about 95% to about 99%, preferably, from about 96% to about 98%. In one example, the non-selective etch solution may contain, by volume, about 0.9% of sulfuric acid, about 2.2% of hydrogen peroxide, and about 97% or the remainder of deionized water. The substrate may be rinsed with deionized water after the non-selective etch process and/or the selective etch process during a rinse step. In other embodiments, the substrates may also be exposed to a drying gas (e.g., $N_2$ or Ar) during drying step.

In other embodiments, a method provides forming a laminated epitaxial material over an etch stop layer on the wafer or substrate and adhering a support handle thereon. The laminated epitaxial material contains a material partially surrounding or encapsulating at least a portion of the epitaxial material, such as the gallium arsenide material, cell, or layer. The epitaxial material may be formed on a wafer or substrate containing an etch stop layer. Subsequently, the encapsulation material may be disposed over the epitaxial material. The encapsulating material may be laminate containing a polymer, a copolymer, an oligomer, an elastomer, derivatives thereof, or combinations thereof. In other examples, the encapsulating material may contain an adhesive, a laminate, an adhesive laminate, a hot-melt adhesive, an organic material or organic coating, or combinations thereof.

In many embodiments, the encapsulating material may contain or be made from a pressure sensitive adhesive (PSA) material or laminate, and/or contain other materials surrounding at least a portion of the epitaxial material (e.g., gallium arsenide material). The encapsulating material may be a PSA which is a laminate containing polyvinyl, polycarbonate, polyester, derivatives thereof, or combinations thereof. In some examples, the encapsulating material may have a thickness within a range from about 50 nm to about 500 nm, preferably, from about 75 nm to about 200 nm. Many PSA laminates which may be used for the encapsulating material are commercially available as PSA adhesive laminates from 3M Inc., located in St. Paul, Minn.

In other embodiments, the encapsulating material may contain or be made from a hot-melt adhesive surrounding at least a portion of the epitaxial material (e.g., gallium arsenide material). In some examples, the encapsulating material may be a hot-melt adhesive which contains a copolymer, such as an ethylene/vinylacetate (EVA) copolymer or derivatives thereof. A hot-melt adhesive containing an EVA copolymer which may be used for the encapsulating material is WAFER GRIP adhesive film, commercially available from Dynatex International, located in Santa Rosa, Calif.

In alternative embodiments, the encapsulating material may contain an elastomer, such as rubber or derivatives thereof. Alternatively, the encapsulating material may contain a material such as neoprene, latex, or derivatives thereof. In some examples, the encapsulating material may contain a monomer. For example, the encapsulating material may contain an ethylene propylene diene monomer or derivatives thereof.

In many examples of the compositions and methods, the laminated epitaxial material contains gallium arsenide materials and the etch stop layer contains aluminum arsenide or aluminum arsenide derivatives. The etch stop layer may be exposed to a non-selective etch solution and etched at a first rate during a non-selective etch process. Thereafter, the etch stop layer may be exposed to a selective etch solution and etched at a second rate during a selective etch process. The first etch rate is greater than the second etch rate, therefore, a ratio of the non-selective etch rate over the selective etch rate is greater than 1. In various examples, the ratio of the first rate over the second rate may be about 2 or great, such as about 3 or greater, such as about 4 or greater, such as about 5 or greater, or about 10 or greater. The non-selective etch solution and process may have an etch rate of about 0.1 µm/min or greater, such as about 0.3 µm/min or greater, or about 0.5 µm/min or greater. In one example, the non-selective etch rate may be within a range from about 0.05 µm/min to about 1 µm/min, such as about 0.3 µm/min. The selective etch solution and process may have an etch rate of about 0.05 µm/min or greater, such as about 0.07 µm/min or greater, or about 0.1 µm/min or greater. In one example, the selective etch rate may be within a range from about 0.005 µm/min to about 0.5 µm/min, such as about 0.08 µm/min.

In some embodiments, the selective etch solution has a GaAs/AlAs selectivity, that is, removes or etches gallium arsenide over aluminum arsenide, of about 400 or greater, preferably, about 600 or greater, preferably, about 1,000 or greater, and more preferably, about 1,400 or greater. In other embodiments, the selective etch solution has an etching selectivity or a GaAs/AlAs selectivity within a range from about 400 to about 2,000, or higher. In one example, the selective etch solution has an etching selectivity or a GaAs/AlAs selectivity within a range from about 400 to about 2,000, preferably, from about 500 to about 1,600, preferably, from about 600 to about 1,500.

In one example, the etch process is a selective etch process and the substrate containing the stack is exposed to a selective etch solution. In another example, the substrate is initially exposed to a non-selective etch solution during a non-selective etch process, and subsequently is exposed to a selective etch solution during a selective etch process. The substrate may be rinsed with deionized water after the non-selective etch process and/or the selective etch process during a rinse step. In other embodiments, the substrates may also be exposed to a drying gas (e.g., $N_2$ or Ar) during drying step.

In various embodiments, a thin film stack material is provided which includes the etch stop layer disposed on a substrate or wafer, the laminated epitaxial material disposed over the etch stop layer, and a support material or layer disposed over the laminated epitaxial material. The support material may be under tension in order to maintain the laminated epitaxial material under compression. The support material may contain a single layer or multiple layers. In some examples, the support material contains polyethylene terephthalate polyester, polyolefin, derivatives thereof, or other polymeric materials. In other examples, the support material contains a metal or metal alloy.

The ELO process includes peeling the laminated epitaxial material from the etch stop layer and wafer while forming an etch crevice therebetween until the combination of the laminated epitaxial material and the support material is removed from the wafer. The etch stop layer generally contains aluminum arsenide or a derivative thereof. The substrate or wafer may be formed of a variety of materials, such as Group III/IV materials, and may be doped with other elements. In one embodiment, the wafer contains gallium arsenide. The support material or handle may be a single layer of material or multiple layers. In some embodiments, the support material may contain wax, polyethylene, polyester, polyolefin, polyethylene terephthalate polyester, rubber, other polymeric or oligomeric materials, derivatives thereof, or combinations thereof. In some examples, the support material contains polyethylene terephthalate polyester or derivatives thereof, such as a MYLAR® film. In other examples, the support material contains polyolefin or derivatives thereof. In other embodiments, the support material may contain various metals or layers of metals including cobalt, copper, silver, gold, alloys thereof, and combinations thereof.

In embodiments described herein, prior to being laminated, the epitaxial material, cell, or layers may contain gallium arsenide, aluminum gallium arsenide, indium gallium phosphide, alloys thereof, derivatives thereof, or combinations thereof. The epitaxial material may contain one layer of a gallium arsenide material, but usually contains multiple layers of gallium arsenide materials. In some examples, the epitaxial material contains a layer having gallium arsenide and another layer having aluminum gallium arsenide. In another example, the epitaxial material contains a gallium arsenide buffer layer, an aluminum gallium arsenide passivation layer, and a gallium arsenide active layer. The gallium arsenide buffer layer may have a thickness within a range from about 100 nm to about 500 nm, such as about 300 nm, the aluminum gallium arsenide passivation layer has a thickness within a range from about 10 nm to about 50 nm, such as about 30 nm, and the gallium arsenide active layer has a thickness within a range from about 500 nm to about 2,000 nm, such as about 1,000 nm. In some examples, the epitaxial material further contains a second aluminum gallium arsenide passivation layer.

In some embodiments herein, the epitaxial material may contain a cell structure containing multiple layers. The cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof. In many examples, the gallium arsenide is n-doped or p-doped.

The etch stop layer contains aluminum arsenide, alloys thereof, derivatives thereof, or combinations thereof. In one example, the etch stop layer contains an aluminum arsenide layer and has a thickness of about 20 nm or less, preferably, within a range from about 1 nm to about 10 nm, and more preferably, from about 4 nm to about 6 nm. The wafer or underlying substrate usually contains gallium arsenide or derivatives thereof, and may be n-doped or p-doped.

In some examples of a non-selective etch solution, an epitaxial sample on a 2 cm×2 cm wafer is exposed to a non-selective etch solution which contains about 100 mL of water, about 1 mL of sulfuric acid (about 96%), and about 8 mL of hydrogen peroxide (about 30%). In other examples, an epitaxial sample on a 2 inch diameter round wafer is exposed to a non-selective etch solution which contains about 500 mL of water, about 5 mL of sulfuric acid (about 96%), and about 40 mL of hydrogen peroxide (about 30%). In other examples, four epitaxial samples, each on a 2 inch diameter round wafer are exposed to a non-selective etch solution which contains about 800 mL of water, about 8 mL of sulfuric acid (about 96%), and about 64 mL of hydrogen peroxide (about 30%).

In some examples of a selective etch solution, an epitaxial sample on a 2 cm×2 cm wafer is exposed to a selective etch solution which contains about 100 mL of water, about 20 g of succinic acid, about 6.7 mL of hydrogen peroxide (about 30%), and about 6-8 mL of ammonium hydroxide (about 29%) until a pH of about 4.2. In other examples, an epitaxial sample on a 2 inch diameter round wafer is exposed to a selective etch solution which contains about 500 mL of water, about 100 g of succinic acid, about 33.5 mL of hydrogen peroxide (about 30%), and about 30-40 mL of ammonium hydroxide (about 29%) until a pH of about 4.2. In other examples, four epitaxial samples, each on a 2 inch diameter round wafer are exposed to a selective etch solution which contains about 800 mL of water, about 160 g of succinic acid, about 53.6 mL of hydrogen peroxide (about 30%), and about 50-60 mL of ammonium hydroxide (about 29%) until a pH of about 4.2.

In one example, a substrate contains a etch stop layer disposed on a wafer, a laminated epitaxial material disposed on the etch stop layer, and a support material disposed over the epitaxial material. The wafer is a gallium arsenide wafer having the dimensions of 4 inch×4 inch. The etch stop layer contains aluminum arsenide, while the laminated epitaxial material contains a gallium arsenide cell and is coated by a PDA laminate. The substrate is placed into a container containing about 400 mL of non-selective etch solution. The non-selective etch solution contains sulfuric acid, hydrogen peroxide, and water at a volumetric ratio of about 1 to about 8 to about 100, respectively. The non-selective etch solution is at room temperature, such as at a temperature within a range from about 18° C. to about 23° C. The non-selective etch solution is agitated for about 8 minutes before the substrate is removed from the bath.

Subsequently, the substrate is rinsed with deionized water and then exposed to a flow of gas (e.g., $N_2$ or Ar) during a drying step. The substrate is then placed into a container containing about 400 mL of selective etch solution. The selective etch solution contains succinic acid, hydrogen peroxide, ammonium hydroxide, and water at a weight ratio of about 10 to about 1 to about 1 to about 55, respectively. The selective etch solution is at room temperature, such as at a temperature within a range from about 18° C. to about 23° C. The selective etch solution is agitated for about 5 minutes before the substrate is removed from the bath. The etch stop layer containing aluminum arsenide was preserved and protected the underlying wafer.

While the foregoing is directed to embodiments of the invention, other and further embodiments of the invention may be devised without departing from the basic scope thereof, and the scope thereof is determined by the claims that follow.

The invention claimed is:

1. A method for forming a thin film material for at least one of a solar device, a semiconductor device, or an electronic device during an epitaxial lift off process, comprising:
    exposing a substrate to a selective etch solution comprising succinic acid during a selective etch process, wherein the substrate comprises a support handle disposed on a laminated epitaxial material disposed on an etch stop layer disposed on the substrate; and
    peeling the laminated epitaxial material from the substrate while exposing the substrate to the selective etch solution.

2. The method of claim 1, wherein the selective etch solution further comprises an ammonium hydroxide compound.

3. The method of claim 2, wherein the ammonium hydroxide compound is ammonium hydroxide, alkylammonium hydroxides, or derivatives thereof.

4. The method of claim 1, wherein the selective etch solution further comprises an oxidizing agent.

5. The method of claim 4, wherein the oxidizing agent comprises a reagent selected from the group consisting of hydrogen peroxide, organic peroxides, ozone, water, derivatives thereof, and combinations thereof.

6. The method of claim 1, wherein the selective etch solution further comprises hydrogen peroxide, ammonium hydroxide, and water.

7. The method of claim 6, wherein the selective etch solution comprises the succinic acid at a weight concentration within a range from about 5% to about 25%.

8. The method of claim 7, wherein the selective etch solution comprises the ammonium hydroxide at a weight concentration within a range from about 0.5% to about 5%.

9. The method of claim 7, wherein the selective etch solution comprises the water at a weight concentration within a range from about 70% to about 95%.

10. The method of claim 6, wherein the selective etch solution comprises:
   the succinic acid at a weight concentration within a range from about 10% to about 20%;
   the hydrogen peroxide at a weight concentration within a range from about 1% to about 3%;
   the ammonium hydroxide at a weight concentration within a range from about 1% to about 3%; and
   the water at a weight concentration within a range from about 74% to about 88%.

11. The method of claim 1, wherein the selective etch solution has a pH value within a range from about 3.6 to about 4.8.

12. The method of claim 1, wherein the laminated epitaxial material comprises gallium arsenide and the etch stop layer comprises aluminum arsenide.

13. The method of claim 12, wherein the laminated epitaxial material comprises an adhesive surrounding at least a portion of the gallium arsenide.

14. The method of claim 12, wherein a GaAs/AlAs selectivity for said selective etch solution is about 1,000 or greater.

15. The method of claim 1, further comprising exposing the substrate to a non-selective etch solution during a non-selective etch process prior to exposing the substrate to the selective etch solution.

16. The method of claim 15, wherein the non-selective etch solution comprises sulfuric acid and hydrogen peroxide.

17. The method of claim 16, wherein the non-selective etch solution comprises sulfuric acid at a volumetric concentration within a range from about 0.4% to about 2%.

18. The method of claim 16, wherein the non-selective etch solution comprises hydrogen peroxide at a volumetric concentration within a range from about 1% to about 5%.

19. A method for forming a thin film material for at least one of a solar device, a semiconductor device, or an electronic device during an epitaxial lift off process, comprising:
   exposing a substrate to a selective etch solution during a selective etch process, wherein the substrate comprises a support handle disposed on a laminated epitaxial material disposed on an etch stop layer disposed on the substrate, and the selective etch solution comprises succinic acid, hydrogen peroxide, and an ammonium hydroxide compound; and
   peeling the laminated epitaxial material from the substrate while compressing the laminated epitaxial material and exposing the substrate to the selective etch solution.

20. A method for forming a thin film material for at least one of a solar device, a semiconductor device, or an electronic device during an epitaxial lift off process, comprising:
   forming a laminated epitaxial material over an etch stop layer on a substrate;
   adhering a support handle onto the laminated epitaxial material;
   exposing the substrate to a selective etch solution comprising succinic acid during a selective etch process; and
   peeling the laminated epitaxial material from the substrate while exposing the substrate to the selective etch solution.

* * * * *